United States Patent [19]

Smith et al.

[11] Patent Number: 4,933,572

[45] Date of Patent: Jun. 12, 1990

[54] DUAL MODE VOLTAGE REFERENCE CIRCUIT AND METHOD

[75] Inventors: Douglas S. Smith; Derek F. Bowers, both of Sunnyvale, Calif.

[73] Assignee: Precision Monolithics, Inc., Santa Clara, Calif.

[21] Appl. No.: 418,908

[22] Filed: Oct. 5, 1989

Related U.S. Application Data

[63] Continuation of Ser. No. 169,308, Mar. 17, 1988, abandoned.

[51] Int. Cl.[5] .......................... H03K 3/01; H03M 1/00

[52] U.S. Cl. .................................. 307/296.1; 307/360; 323/313; 341/121

[58] Field of Search .................. 307/296.6, 296.1, 359, 307/366, 361, 362, 363; 341/121, 155, 158; 323/313, 314

[56] References Cited

U.S. PATENT DOCUMENTS 4,131,884 12/1978 Comer ................................ 341/121
4,254,406 3/1981 Meares ................................ 341/158
4,415,881 11/1983 Lechner et al. ..................... 341/158
4,613,768 9/1986 Pommer, II ..................... 307/296 R
4,634,894 1/1987 Shu et al. ........................ 307/296 R

*Primary Examiner*—Stanley D. Miller
*Assistant Examiner*—Richard Roseen
*Attorney, Agent, or Firm*—Koppel & Jacobs

[57] ABSTRACT

A voltage reference circuit is described which is capable of providing either an internally generated voltage having a trimming capability, or an externally generated voltage, with the use of only two pins. The internal voltage is connected through an interrupt circuit to an input/output terminal, which can also receive an externally generated voltage. A trimming terminal is used to apply trimming voltage signals to adjust the internally generated voltage. To convert from the internal to the external voltage source, an interrupt voltage is applied to the trimming terminal which is outside of the normal trimming voltage range. This interrupt voltage actuates an interrupt circuit to interrupt the connection between the internal voltage source and input/output terminal, leaving the output terminal available for the external voltage source.

15 Claims, 1 Drawing Sheet

DUAL MODE VOLTAGE REFERENCE CIRCUIT AND METHOD

This is a continuation of co-pending application Ser. No. 07/169,308 filed on Mar. 17, 1988, now abandoned.

BACKGROUND OF THE INVENTION

1. Field of the Invention

This invention relates to voltage reference circuits, and more particularly to voltage reference circuits and methods in which the user can select between a trimmable, internally generated reference voltage, and an externally applied reference voltage.

2. Description of the Prior Art

It is often desirable, for applications such as supplying a reference voltage for an analog-to-digital converter (ADC), to provide a voltage reference circuit which permits the user to select a voltage that is internally generated by the circuit, or to apply a different externally generated voltage through the integrated circuit pins. Also, it is normally desirable to be able to trim the internally generated voltage to ensure that it is within the designed tolerance, since normal fabrication variations and the like will typically result in some of the circuits generating inaccurate voltage levels. Although these needs have been satisfied in the past, it has required the use of three separate pins on the circuit element: one to receive an external voltage source, a second to provide an output for the internally generated voltage, and a third to receive trimming voltages used to trim the internally generated reference. Since pins on an integrated circuit package are frequently at a premium, it would be helpful if these functions could be accomplished with fewer than three pins.

SUMMARY OF THE INVENTION

In view of the above problem associated with the prior art, the object of the present invention is to provide a voltage reference circuit and method which is capable of supplying either an internally or an externally generated voltage, and of trimming the internally generated voltage, with only two pins. This object is accomplished by connecting an internal, trimmable reference voltage source within a voltage reference circuit in circuit with a voltage reference terminal, and connecting a trimming terminal to apply a trimming voltage to the reference voltage source. An interrupt circuit is provided which responds to an interrupt voltage at the trimming terminal, the interrupt voltage being within a range outside of the trimming voltage range, to interrupt the connection between the internal reference voltage source and the voltage reference terminal. This in turn enables the application of an externally generated reference voltage to the voltage reference terminal. Thus, a trimmed, internally generated reference voltage is supplied when a trimming voltage is present at the trimming terminal, while the voltage reference terminal serves to input an externally applied reference voltage when a non-trimming voltage level is applied to the trimming terminal.

In the preferred embodiment, the internal reference voltage source is connected to the output terminal by means of a switch. The switch is actuated to disconnect the internal reference voltage source from the output terminal in response to an interrupt voltage level at the trimming terminal. The interrupt voltage is within an interrupt range that is greater in absolute magnitude than the voltages within the trimming voltage range. When a supply voltage source is provided, the interrupt voltage range may be made to fit the supply voltage level. Thus, by simply connecting the supply voltage terminal to the trimming terminal, the connection between the internal voltage source and the output voltage reference terminal is interrupted.

The invention thus provides a dual mode voltage reference that uses only two pins: in one mode a trimmed, internally generated reference voltage is supplied, while in the other mode an externally generated voltage is supplied to the internal circuit. These and other features and advantages of the invention will be apparent to those skilled in the art from the following detailed description of a preferred embodiment, taken together with the accompanying drawing, in which:

DETAILED DESCRIPTION OF PREFERRED EMBODIMENTS

Figure 1:
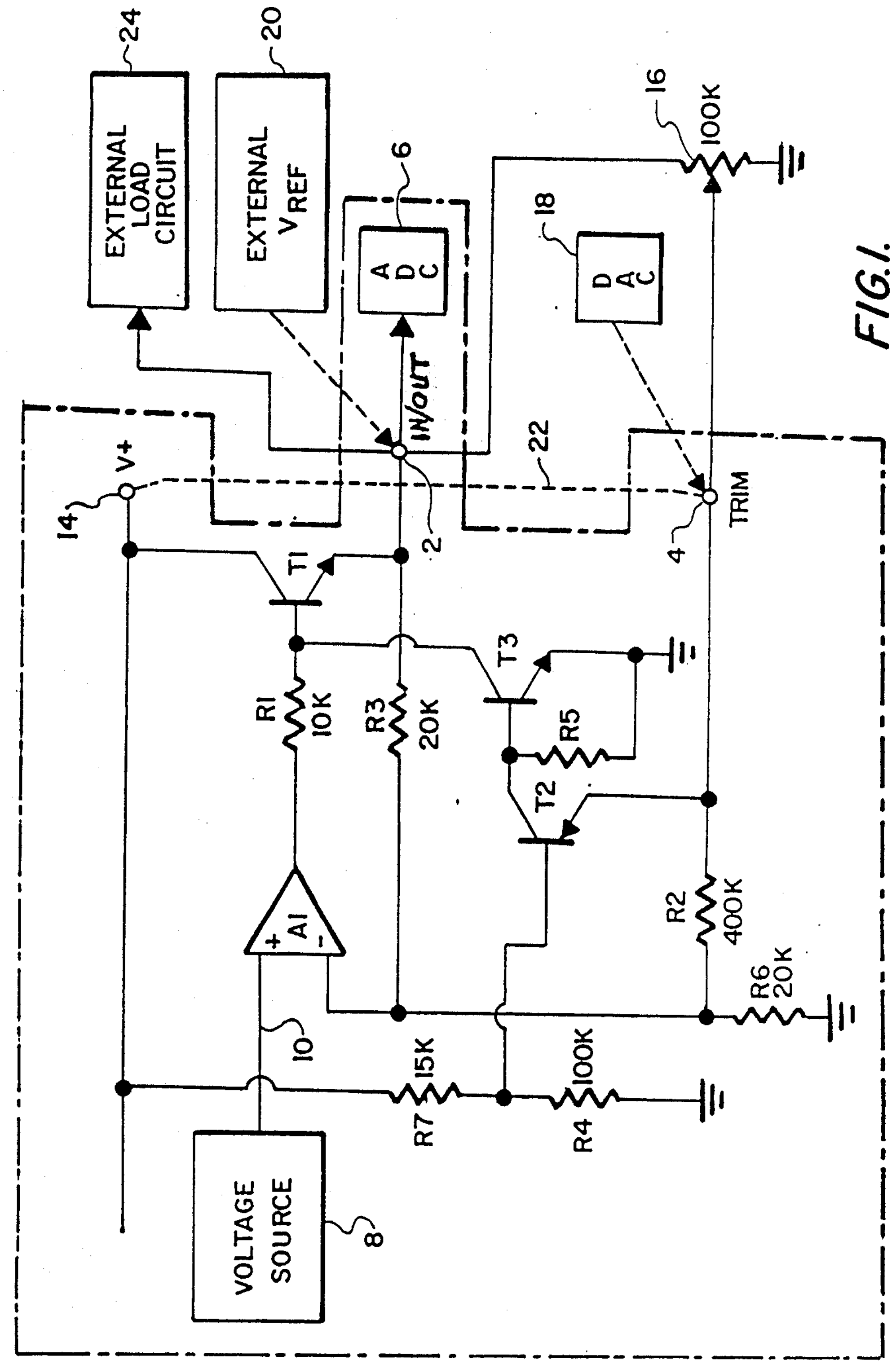
FIG. 1 is a partially block and partially schematic diagram of a dual mode voltage reference circuit constructed in accordance with the invention.

A preferred embodiment of the invention is shown in FIG. 1. It employs only two pins, represented as voltage terminal 2 and trimming terminal 4. These two terminals give the user the flexibility of using the internal reference voltage, trimmed or untrimmed, or connecting an external reference voltage to an internal digital-to-analog converter (DAC), ADC or other circuit requiring a reference voltage. The internal circuity on an IC Chip is enclosed within phantom lines in FIG. 1.

An internal voltage source 8 generates a reference voltage which is brought out on lead 10. The internal reference voltage source may be implemented in several conventional ways, such as a bandgap voltage reference or a zener diode reference. Typically a supply voltage V+ at supply voltage pin 14 would be +15 volts, the voltage source 8 would generate 5 volts, and 10 V would be the output voltage at terminal 2 when the trimming voltage is below an interrupting level to be described later.

The voltage at terminal 2 is controlled by the open loop gain of an amplifier A1, a feedback network comprising transistor T1 and internal resistors R3 and R6, a resistor R2 connected between the R3/R6 junction and trimming terminal 4, and an external variable resistor 16. With equal values for R3 and R6, (typically 20 kilohms each), a 5 volt reference applied to the amplifier's non-inverting input would yield 10 volts at terminal 2. This voltage is then trimmable by either adding or subtracting a small current through R3, from a potentiometer 16. A typical value for R2 would be 400 kilohms, and the variable resistor should be of the order of 100 kilohms. The open loop gain of the amplifier should be enough to overcome the voltage drop incurred by R1 and the base-emitter of T1, and still regulate terminal 2 to 12-bit accuracy.

With transistor T1 held on by a positive voltage from op amp A1 at its base via resistor R1, the reference voltage output level at terminal 2 is tied to the internal source 8 through the intervening circuit elements. In this mode a trimming voltage can be applied to trimming terminal 4 to adjust the output voltage level on terminal 2, in case it is not at the desired reference level because of circuit tolerances. Trimming terminal 4 is connected to the inverting input of op amp A1 through a resistor R2; another resistor R3 provides a feedback element between the emitter of transistor T1 and the inverting input of op amp A1. By controlling the voltage at trimming terminal 4, the output of op amp A1 can be adjusted to provide the desired voltage level at output terminal 2. The trimming voltage applied to terminal 4 can be derived in a conventional manner from potentiometer 16, which is fed by some convenient voltage supply such as output terminal 2 itself. It is an advantage of the present invention that it permits potentiometer 16 to be replaced with a digital-to-analog converter 18, shown connected to trimming terminal 4 by a dashed line connection, thus raising the reliability of the system.

The circuit described thus far provides an internally generated, trimmed voltage at output terminal 2. In certain circumstances, it is also desirable to be able to supply the internal load, such as one or more ADCs 6, a DAC, a comparator, an analog multiplier or some other circuit requiring a reference voltage, with a voltage produced by an external voltage reference source 20. While prior voltage references have this capability, they require an additional terminal or pin to receive the external voltage. It is a distinct advantage of the present invention that an external voltage source can be accommodated without using up any more pins. For this purpose, a special interrupt circuit is provided which interrupts the connection between internal voltage source 8 and output terminal 2 when an external voltage is desired, thus leaving output terminal 2 free to accept the external voltage.

The preferred form of the interrupt circuit includes a pnp transistor T2 whose emitter is connected to trimming terminal 4. The base of T2 is kept at a constant voltage level by a connection to a voltage divider circuit consisting of resistors R7 and R4, which are connected between V+ and ground. The collector of T2 is connected to the base of an npn transistor T3, the emitter of which is grounded and the collector of which is connected to the base of transistor T1. A resistor R5 is connected between the base and emitter of T3.

Resistors R7 and R4 are selected such that transistor T2 is held off when the voltage at trimming terminal 4 (and thereby at the emitter of T2) is within the desired trimming voltage range, but is held closed in a conductive state when the voltage at trimming terminal 4 is within some specified interrupt range outside of the trimming voltage range. For example, if the trimming voltage is limited to a maximum of 10 volts, the voltage at the base of transistor T2 could be set at some value greater than 10 volts. In that case, transistor T2 will not become conductive until the voltage applied to trimming terminal 4 exceeds the base voltage of T2 (plus its base-emitter voltage drop). When T2 does become conductive it turns on transistor T3, which is turn grounds the base of transistor T1 to hold T1 non-conductive. This opens up the connection between internal voltage source 8 and output terminal 2 with a high impedance interruption, thereby permitting the output of external voltage reference source 20 to be applied directly to terminal 2. For a negative reference voltage, the circuit polarity would simply be reversed.

A convenient way to place the circuit in an external voltage reference mode is to simply connect a lead, indicated by dashed line 22, between V+ terminal 14 and trimming terminal 4. With V+ at 15 volts and a trimming voltage range of 0–10 volts, the relative values of R7 and R4 can be selected to establish any desired threshold voltage between 10 and 15 volts (at trimming terminal 4) for turning on transistor T2. To ensure against errors due to manufacturing tolerances, a substantial gap is preferably left between the maximum trimming voltage, and the threshold voltage at trimming terminal 4 that will convert the circuit to its external reference mode. Typical resistance values are provided in FIG. 1, but are not to be considered as limiting.

The described circuit thus makes possible the provision of an internally generated voltage, an externally generated voltage, and a trimming capacity for the internally generated voltage, with the use of only two pins. In addition to supplying an internal load 6, output terminal 2 can at the same time be used as a voltage reference for an external load circuit 24. Since numerous variations and alternate embodiments will be apparent to those skilled in the art, it is intended that the invention be limited only in terms of the appended claims.

We claim:

1. A voltage reference circuit for supplying at the user's option a trimmable, internally generated reference voltage or an externally generated reference voltage, comprising:

an input/output terminal, a trimmable voltage source internal to said voltage reference circuit for generating said trimmable internally generated reference voltage, connection circuit means connecting said trimmable voltage source to apply said trimmable internally generated reference voltage to said input/output terminal, a trimming terminal separate from said input/output terminal and connected in circuit with the connection circuit means to apply a trimming voltage within a predetermined trimming voltage range to dynamically trim said trimmable internally generated reference voltage applied to said input/output terminal from said trimmable voltage source, and interrupt circuit means responsive to an interrupt voltage at said trimming terminal to produce an interruption in the connection provided by said connection circuit means, said interrupt voltage being within an interrupt voltage range which is outside of said trimming voltage range, allowing the user the option of applying an externally generated reference voltage to the same said input/output terminal without interference from said trimmable internally generated reference voltage during said interruption.

2. The voltage reference circuit of claim 1, said connection circuit means comprising a switch, and said interrupt circuit means comprising means responsive to said interrupt voltage for actuating said switch to disconnect said voltage source from said input/output terminal.

3. The voltage reference circuit of claim 2, wherein said switch modifies the output of said voltage source in applying said trimmable internally generated reference voltage to said input/output terminal during said interruption.

4. The voltage reference circuit of claim 1, further including a supply voltage terminal, wherein said trimming terminal is connectable to said supply voltage terminal to provide an interrupt voltage for interrupting the connection provided by said connection means.

5. The voltage reference circuit of claim 1, wherein said interrupt voltage is within an interrupt range of voltages that are greater in absolute value than the voltages within said trimming voltage range.

6. The voltage reference circuit of claim 1, implemented as an integrated circuit, and further comprising a load circuit within said integrated circuit which is permanently connected to said input/output terminal to receive the reference voltage supplied by said voltage reference circuit.

7. The voltage reference circuit of claim 6, said load circuit comprising an analog-to-digital converter.

8. A reference voltage circuit for supplying at the user's option a trimmable, internally generated reference voltage or an externally generated reference voltage, comprising:

an input/output terminal, a voltage source internal to said voltage reference circuit for generating an intermediate voltage signal, a dual-input operational amplifier having one input connected to receive said intermediate voltage signal, and an output, a supply voltage terminal separate from said input/output terminal, a transistor switch having an input connected in circuit with said supply voltage terminal, an output connected in circuit with said input/output terminal, and a control connected in circuit with the output of said dual-input operational amplifier, a feedback circuit for said dual-input operational amplifier connected between the output and said other input of said dual-input operational amplifier and including said transistor switch, said feedback circuit establishing said trimmable internally generated reference voltage at said input/output terminal, a trimming terminal separate from said input/output terminal and said supply voltage terminal, trimming circuit means connecting said trimming terminal to the other input of said dual-input operational amplifier to dynamically trim said trimmable internally generated reference voltage in response to a trimming voltage within a predetermined trimming voltage range at said trimming terminal, and interrupt circuit means connecting said trimming terminal to said transistor switch control, said interrupt circuit means being responsive to an interrupt voltage at the trimming terminal to open said transistor switch and thereby allow the user the option of applying an externally generated reference voltage to the same said input/output terminal without interference from said trimmable internally generated reference voltage during said interruption, said interrupt voltage being within an interrupt voltage range which is outside of said voltage range.

9. The voltage reference circuit of claim 8, said interrupt circuit means comprising a transistor bias circuit which responds to an interrupt voltage by applying to the control of said transistor switch a voltage within a voltage range at which said transistor switch disconnects said input/output terminal from said reference voltage source.

10. The voltage reference circuit of claim 8, further comprising means for connecting said supply voltage terminal to provide an interrupt voltage to said trimming terminal.

11. The voltage reference circuit of claim 10, wherein said supply voltage is approximately 15 volts, said trimmable internally generated reference voltage applied to said input/output terminal through said transistor switch is approximately 10 volts, and the upper limit of said trimming voltage range is approximately 10 volts.

12. The voltage reference circuit of claim 8, wherein said interrupt voltage is within an interrupt range of voltages that are greater in absolute magnitude than the voltages within said trimming voltage range.

13. A method of selecting between a trimmable reference voltage internally generated by a reference voltage circuit and an externally generated reference voltage, including the steps of:

when said trimmable internally generated reference voltage is desired, connecting said reference voltage circuit to supply said trimmable internally generated reference voltage to an input/output terminal, applying a trimming voltage within a predetermined trimming voltage range through a trimming terminal to said reference voltage circuit, and obtaining said trimmable internally generated reference voltage from said input/output terminal, and when an externally generated reference voltage is desired, (1) interrupting the connection between the output of said reference voltage circuit and said input/output terminal by (a) applying an interrupt voltage outside of said trimming voltage range to said trimming terminal, and (b) providing interrupt circuitry within said reference voltage circuit which interrupts said connection in response to said interrupt voltage at said trimming terminal, (2) applying said externally generated reference voltage to said input/output terminal, and (3) obtaining said externally generated reference voltage from said input/output terminal as an output from said reference voltage circuit.

14. The method of claim 13, wherein said connection between the output of said reference voltage circuit and said input/output terminal is interrupted when an externally generated reference voltage is desired by connecting a supply voltage for said reference voltage circuit to aid trimming terminal.

15. The method of claim 13, wherein said interrupt voltage is within an interrupt range of voltages that are greater in absolute magnitude than the voltages within said trimming voltage range.

* * * * *